US012641919B2

(12) United States Patent
Mai et al.

(10) Patent No.: US 12,641,919 B2
(45) Date of Patent: May 26, 2026

(54) MASS TRANSFER SYSTEM, ATTACHING DEVICE, AND MASS TRANSFER METHOD

(71) Applicant: Century Technology (Shenzhen) Corporation Limited, Shenzhen (CN)

(72) Inventors: Chen-Fu Mai, New Taipei (TW); Meng-Chieh Tai, New Taipei (TW); Yu Zhang, Shenzhen (CN); Min Hu, Shenzhen (CN); Lan-Qing Xiao, Shenzhen (CN); Ping Liu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 554 days.

(21) Appl. No.: 18/113,325

(22) Filed: Feb. 23, 2023

(65) Prior Publication Data

US 2023/0317872 A1      Oct. 5, 2023

(30) Foreign Application Priority Data

Mar. 30, 2022    (CN) ......................... 202210333832.X

(51) Int. Cl.
H10H 20/01          (2025.01)
(52) U.S. Cl.
CPC .................................. H10H 20/01 (2025.01)
(58) Field of Classification Search
CPC ............................ H10H 20/01; H01L 25/0753
See application file for complete search history.

(56) References Cited

U.S. PATENT DOCUMENTS

| | | | |
|---|---|---|---|
| 11,142,452 B2 | 10/2021 | Hsu et al. | |
| 2018/0188431 A1* | 7/2018 | Zhou | G01B 5/14 |
| 2018/0261582 A1* | 9/2018 | Henry | H10D 86/0214 |
| 2019/0181023 A1* | 6/2019 | Saketi | H01L 25/0753 |
| 2021/0005642 A1* | 1/2021 | Chen | H10D 86/451 |
| 2022/0077122 A1* | 3/2022 | Park | H10H 20/018 |
| 2023/0043726 A1* | 2/2023 | Xiao | H10H 20/01 |

FOREIGN PATENT DOCUMENTS

| | | |
|---|---|---|
| CN | 109524339 A | 3/2019 |
| TW | I696261 B | 6/2020 |
| TW | 202103355 A | 1/2021 |

* cited by examiner

*Primary Examiner* — Ratisha Mehta
(74) *Attorney, Agent, or Firm* — ScienBiziP, P.C.

(57)          ABSTRACT

A mass transfer system comprises a flexible substrate, a display substrate, and an attaching device. The flexible substrate defines a plurality of wells configured to adsorb one of a plurality of LEDs. The display substrate defines a plurality of connecting pads configured to bond one of the LEDs. The attaching device is configured to attach the flexible substrate to the display substrate. The flexible substrate releases the LEDs after being attached to the display substrate to transfer the LEDs to the display substrate. An attaching device and a mass transfer method are also disclosed.

5 Claims, 6 Drawing Sheets

MASS TRANSFER SYSTEM, ATTACHING DEVICE, AND MASS TRANSFER METHOD

FIELD

The subject matter herein relates to mass transfer systems for transferring LEDs, attaching devices of the mass transfer systems and mass transfer methods.

BACKGROUND

Liquid crystal displays (LCDs) are currently a favorite in the display technology. As technology for display devices develops, the requirements of display resolution and contrast are getting higher and higher. Micro light-emitting diodes (LEDs) technology offers higher brightness, better efficiency of luminosity, and lower power consumption, and has prospects for further development.

However, because of the small size of micro LEDs, transferring a large number of micro LEDs to a display substrate with high efficiency and low cost remains challenging.

BRIEF DESCRIPTION OF THE DRAWINGS

Implementations of the present disclosure will now be described, by way of embodiment, with reference to the attached figures.

FIG. 3 is a top view of a flexible substrate of a mass transfer system according to the first embodiment of the present disclosure.

DETAILED DESCRIPTION

Figure 1:
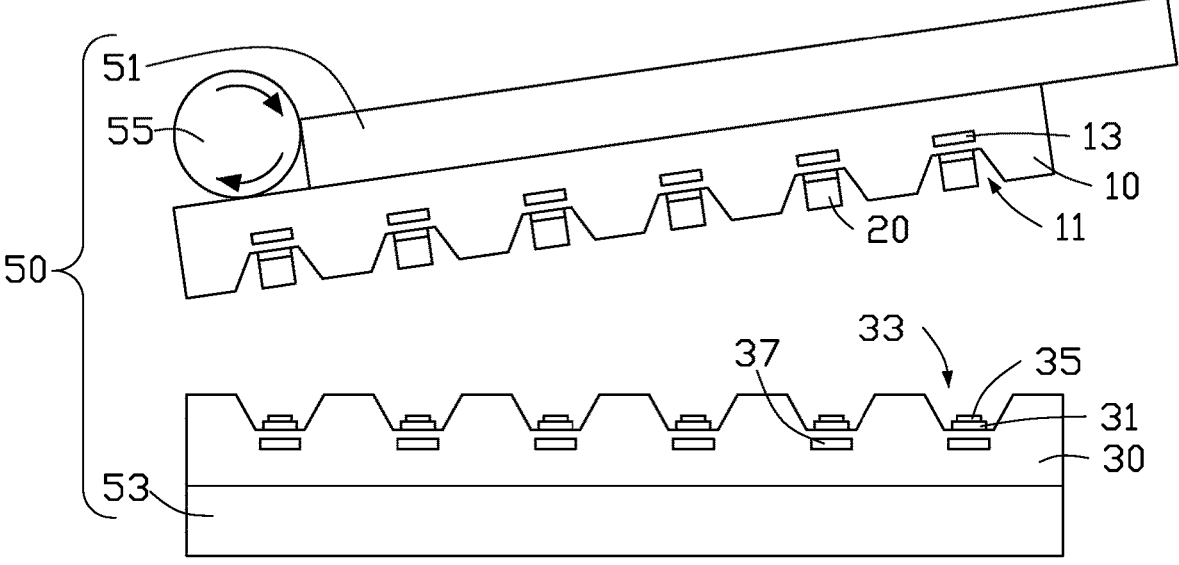
FIG. 1 is a partial side view of a mass transfer system according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "LED" is defined as a micro LED or a mini LED with a size from a few microns to hundreds of microns.

First Embodiment

FIG. 1 shows a mass transfer system 100 used to transfer a large number (tens or hundreds of thousands) of LEDs at one time according to a first embodiment of the present disclosure. The mass transfer system 100 includes a flexible substrate 10, a display substrate 30, and an attaching device 50.

The flexible substrate 10 defines a plurality of wells 11. Each well 11 is configured to receive and adsorb a LED 20. The display substrate 30 includes a plurality of connecting pads 31. Each connecting pad 31 is configured to bond a LED 20. The attaching device 50 is configured to attach the flexible substrate 10 to the display substrate 30, and to make a surface of the flexible substrate 10 having the LEDs 20 adsorbed touch to the display substrate 30, so that each well 11 is aligned with one connecting pad 31. The flexible substrate 10 is used to release the LEDs 20 to transfer the LEDs to the display substrate 30.

Figure 2:
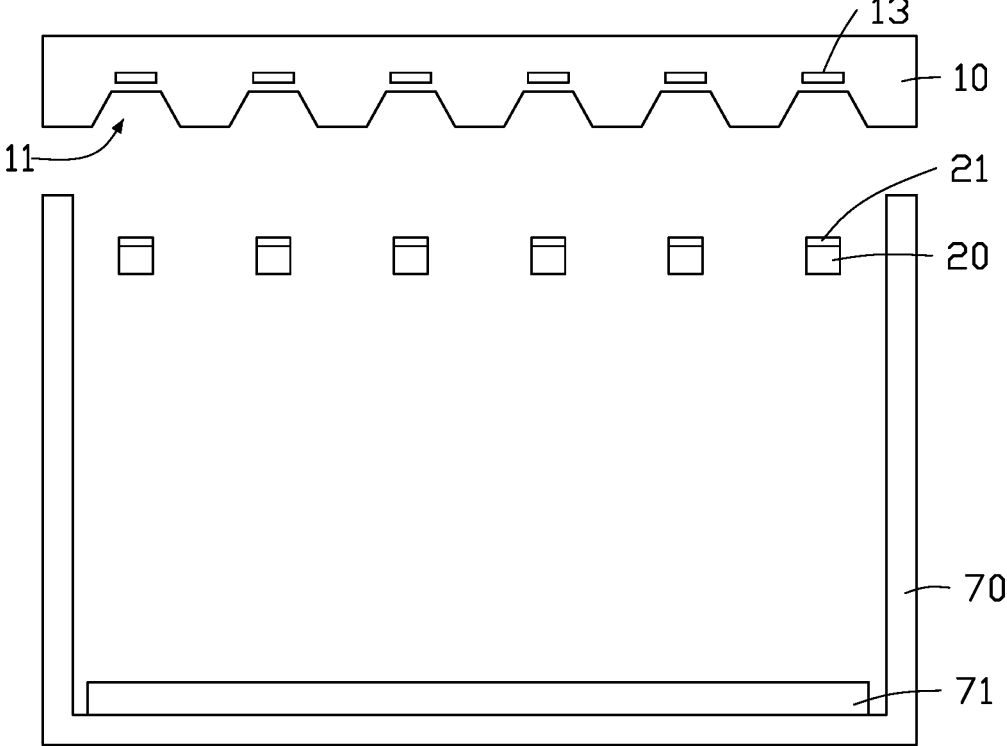
FIG. 2 is another partial side view of the mass transfer system according to the first embodiment of the present disclosure.

In this embodiment, as FIG. 2 shows, the mass transfer system 100 also includes at least one chamber 70. The chamber 70 is configured to accommodate the LEDs 20, so that the flexible substrate 10 can adsorb the LEDs 20 from the chamber 70.

In this embodiment, each LED 20 includes a first magnetic pole 21, and the chamber 70 includes a magnetic suspension device 71 configured to generate a same magnetism as the first magnetic pole 21 to make the LEDs 20 suspend in the chamber 70.

The first magnetic pole 21 is at an end of the LED 20 and makes the LEDs 20 only have the magnetism given by the first magnetic pole 21. The magnetic suspension device 71 provides the magnetism same as the first magnetic pole 21 and allows the LEDs 20 in the chamber 70 all are within a magnetic field generated by the magnetic suspension device 71. As a result, according to the rule for magnets that like poles repel, when the first magnetic pole 21 and the magnetic suspension device 71 have the same magnetism, the LEDs 20 will be repulsed by the magnetic suspension device 71, thus be suspended in the chamber 10, and the first magnetic pole 21 is oriented away from the magnetic suspension device 71.

In this embodiment, the first magnetic pole 21 also functions as an electrode of the LED 20. The following description will take the first magnetic pole 21 is the electrode of the LED 20 for example. In other embodiments, the first magnetic pole 21 may be formed by an additional magnetic material positioned at an end of the LED 20 with at least one electrode of the LED 20.

The magnetic suspension device 71 is composed of a magnetic material. Alternatively, the magnetic suspension device 71 can be an electromagnetic device that generates magnetism through electrification. Also, the magnetic suspension device 71 can include both magnetic material and electromagnetic device. When the magnetic suspension device 71 is an electromagnetic device, the magnetism is generated by energizing the magnetic suspension device 71. By controlling the intensity of the current passing through the magnetic suspension device 71, the intensity of the magnetism generated by the magnetic suspension device 71 can also be adjusted.

In this embodiment, the flexible substrate 10 is made of flexible material, that is, flexible substrate 10 can be bent to a certain extent. The flexible substrate 10 is a layered structure, which is used to adsorb LED 20 on one side.

In this embodiment, the flexible substrate 10 includes at least one first magnetic field generator 13 configured to generate a magnetic field at the position of each well 11 to adsorb the first magnetic pole 21, so that each well 11 can adsorb a LED 20. Specifically, the flexible substrate 10 is provided with one first magnetic field generator 13 at a position corresponding to each well 11. Each first magnetic field generator 13 is used to generate a magnetism opposite to the first magnetic pole 21. When the flexible substrate 10 is close to the chamber 70, the magnetic field generated by the magnetic field generators 13 will close to the LEDs 20 suspended in the chamber 70. As a result, according to the rule for magnets that unlike poles attract, the first magnetic pole 21 will be attracted by the first magnetic field generator 13 when the magnetism of the first magnetic field generator 13 is opposite to the magnetism of the first magnetic pole 21, so that the first magnetic pole 21 will drive the LED 20 to move towards the first magnetic field generator 13, and then fall into the well 11 corresponding to the first magnetic field generator 13. Finally, the plurality of LEDs 20 transfer from the chamber 70 to the flexible substrate 10.

In this embodiment, each first magnetic field generator 13 is an electromagnetic device that generates magnetism through electrification, such as electromagnetic coil, electromagnet, etc. In other embodiments, one first magnetic field generator 13 may correspond to multiple wells 11, that is, multiple wells 11 share one magnetic field generator 13.

In this embodiment, as FIG. 1 shows, the attaching device 50 includes a first support platform 51, a second support platform 53, and a roller 55. The first support platform 51 is configured to support the flexible substrate 10, the second support platform 53 is configured to support the display substrate 30, and the roller 55 is configured to press the flexible substrate 10 onto the display substrate 30. Specifically, the first support platform 51 can move relative to the second support platform 53, thus driving the flexible substrate 10 close to the display substrate 30. The first support platform 51 supports a surface of the flexible substrate 10 without the wells 11. The roller 55 is arranged at the same side of the flexible substrate 10 having the first support platform 51, and is originally arranged on an edge of the flexible substrate 10. When the first support platform 51 drives the side of the flexible substrate 10 corresponding to the roller 55 to contact with the display substrate 30, the roller 55 starts to roll along the edge of the flexible substrate 10 to the other edge of the flexible substrate 10, thus pressing the flexible substrate 10 and attaching the flexible substrate 10 to the display substrate 30.

In this embodiment, the display substrate 30 includes a plurality of positioning holes 33, each connecting pad 31 is arranged in one positioning hole 33 to bond the LED 20. The positioning holes 33 on the display substrate 30 are set at positions corresponding to the wells 11 on the flexible substrate 10. That is, when the flexible substrate 10 is attached to the display substrate 30, each well 11 is aligned with a positioning hole 33. In other words, the connecting pads 31 on the display substrate 30 are set at positions corresponding to the wells 11 on the flexible substrate 10. The display substrate 30 can also include basic structures such as a switch circuit (such as circuit including array of thin film transistors), conductive traces connecting the switch circuit and the connecting pad 31 (not shown), etc.

In this embodiment, the display substrate 30 also includes a plurality of second magnetic field generator 37 configured to generate a magnetic field on each connecting pad 31 to adsorb the first magnetic pole 21, so that each connecting pad 31 can adsorb one LED 20. Specifically, each connecting pad 31 of the display substrate 30 corresponds to a second magnetic field generator 37 to generate a magnetism opposite to the first magnetic pole 21. When the LED 20 is in the magnetic field generated by the second magnetic field generator 37, according to the principle of mutual attraction of different magnets, the second magnetic field generator 37 will generate attraction to the first magnetic pole 21, thus driving the LED 20 to the connecting pad 31.

In this embodiment, when the flexible substrate 10 attaches to the display substrate 30, by closing the first magnetic field generator 13 and opening the second magnetic field generator 37, the LED 20 can be released from the flexible substrate 10, and be adsorbed on the display substrate 30. In other embodiments, a more powerful magnetic field can be generated by the second magnetic field 37, thus generating a stronger attractive force to strip the LED 20 from the flexible substrate 10.

In this embodiment, each second magnetic field generator 37 corresponds to a positioning hole 33, the second magnetic field generator 37 is an electromagnetic device that generates magnetism through electrification, such as electromagnetic coil, electromagnet, etc. In other embodiments, one second magnetic field generator 37 may correspond to multiple positioning holes 33.

In this embodiment, an adhesive block 35 can be arranged on a connecting pad 31 to bond the connecting pad 31 and the LED 20. Specifically, when the flexible substrate 10 attaches to the display substrate 30, the LED 20 adsorbed on the flexible substrate 10 touches the adhesive block 35, so that the LED 20 is bonded on the connecting pad 31, that is the LED 20 is transferred from the flexible substrate 10 to the display substrate 30. In other embodiments, when the flexible substate 10 attaches to the display sub state 30, the LED 20 does not touch the adhesive block 35, after transferring the LED 20 from the flexible substrate 10 to the display substrate 30 by the second magnetic field generator 37, the LED 20 attaches the adhesive block 37 and bonds on the connecting pad 31.

In this embodiment, the LED 20 is bonded on the connecting pad 31 by the second magnetic field generator 37 and the adhesive block 35 at the same time. In other embodiments, either of the second magnetic field generator 37 and the adhesive block 35 can be used to bond the LED 20 to the connecting pad 31.

In this embodiment, a side of the LED 20 close to the display substrate 30 does not include electrodes, thus the connecting pad 31 only physically bonds to the LED 20, the material of the connecting pad 31 can be conductive or non-conductive. In other embodiments, the LED 20 includes an electrode close to the display substrate 30, the connecting pad 31 is a conductive material. The display substrate 30 also defines a conductive circuit electrically connected to each connecting pad 31 to be electrically connected to the electrode of the LED 20.

In this embodiment, as FIG. 3 shows, the flexible substrate 10 includes different wells 11R, wells 11G, and wells 11B configured to accommodate LEDs 20 emitting different colors of light. The number of the chambers 70 is three, each chamber 70 is configured to accommodate LEDs 20 emitting one color of light. Different LEDs 20 in different chambers 70 emits different colors of light. The flexible substrate 10 can start the first magnetic field generators 13 corresponding to the wells 11R, and close to the chamber 70 accommodates the LEDs 20 configured to emit red light, then start the first magnetic field generators 13 corresponding to the wells 11G, and close to the chamber 70 accommodates the LEDs 20 configured to emit green light, and finally start the first magnetic field generators 13 corresponding to the wells 11B, and close to the chamber 70 accommodates the LEDs 20 configured to emit blue light. As a result, the flexible substrate 10 can transfer the LEDs 20 configured to emit different colors of light to the display substrate 30 at the same time.

In other embodiments, the flexible substrate 10 can only include wells 11R, so that the flexible substrate only adsorbs LEDs 20 with one color at one time, by multiple transfers, the flexible substrate 10 can also transfer LEDs 20 configured to emit different colors of light to the display substrate 30.

In this embodiment, a size of the flexible substrate 10 is the same as a size of the display substrate 30, that is the wells 11 on the flexible substrate 10 correspond one-to-one with the connecting pad 31 on the display substrate 30. In other embodiments, the size of the flexible substrate 10 can be different from the size of the display substrate 30, by multiple transfers, the flexible substrate 10 can transfer LEDs 20 to each connecting pad 31 on the display substrate 30.

In this embodiment, the material of flexible substrate 10 can be polyethylene glycol terephthalate, triacetyl cellulose, or other flexible materials. By arranging the attaching device, the flexible substrate 10 can be smoothly attached to the display substrate 30, so that the LED 20 is completely covered by the flexible substrate 10 during the process of transfer to the display substrate 30.

By setting the flexible substrate 10, the LEDs 20 can be transferred from the chamber 70 to the wells 11, and then transferred from the wells to the display substrate 30. So that the LEDs can achieve batch transfer, which improves the efficiency of transfer. At the same time, by setting the first magnetic field generator 13, the second magnetic field generator 37, and the LEDs 20 with the first magnetic pole 21, the transfer process of LEDs 20 can be enhanced through the magnetic field, which improves the yield. By attaching the flexible substrate 10 to the display substrate 30 to transfer the plurality of LEDs 20, the LEDs 20 can be transferred from the wells 11 to the connecting pads 31 on the display substrate 30, so that the dislocation of LEDs 20 in the transfer process can be avoided, and further improving the product yield.

Second Embodiment

Figure 4:
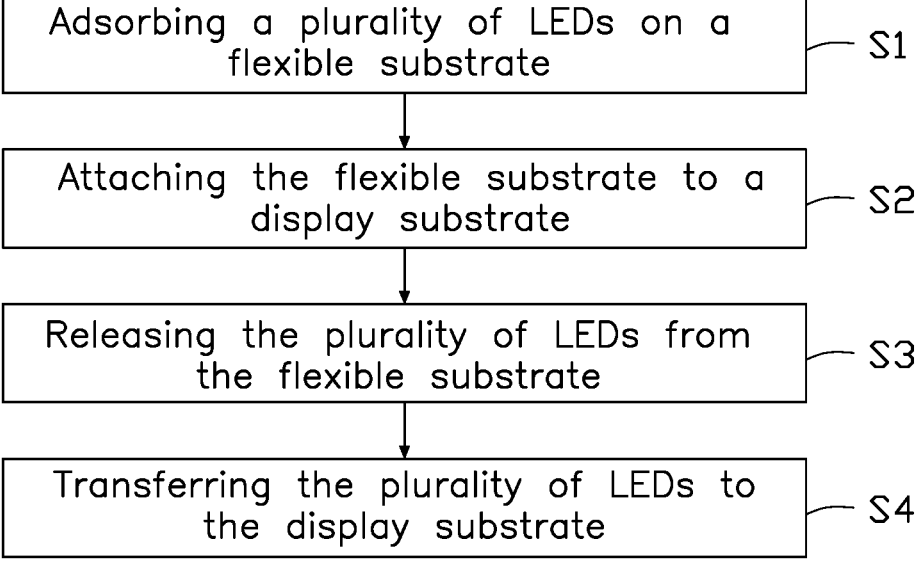
FIG. 4 is a flow chart of a mass transfer method according to a second embodiment of the present disclosure.

The mass transfer method shown in FIG. 4 is provided by way of embodiment, as there are a variety of ways to carry out the method. The method described below can be carried out using the configurations illustrated in FIGS. 1 through 3, FIGS. 5 through 6, for example, and various elements of these figures are referenced in explaining the method. Each block shown in FIG. 4 represents one or more processes, methods, or subroutines, carried out in the method. Additionally, the illustrated order of blocks is by example only and the order of the blocks can change. The method can begin at Block S1, and the mass transfer system 100 endorses the mass transfer method as follows.

The mass transfer method comprises:

Block S1: adsorbing a plurality of LEDs on a flexible substrate;

Block S2: attaching the flexible substrate to a display substrate;

Block S3: releasing the plurality of LEDs from the flexible substrate;

Block S4: transferring the plurality of LEDs to the display substrate.

In this embodiment, before Block S1, the mass transfer method further comprises: providing a chamber 70, placing the LEDs 20 in the chamber 70, and suspending the LEDs 20 in the chamber 70. For example, suspending the LEDs 20 can be achieved by setting a magnetic suspension device 71 to suspend the LEDs 20 with magnetism, or by setting a suspension with a higher density of a density of each LED 20 in the chamber to suspend the LEDs 20.

In this embodiment, each LED 20 is magnetic, the Block S1 comprises: generating a magnetic field on the flexible substrate 10 to adsorb the LEDs 20, and closing the flexible substrate 10 to the LEDs 20. Specifically, the LED 20 has a single magnetism, the flexible substrate 10 generates a magnetism opposite to the LED 20, so that the LED 20 will be attracted by the flexible substrate 10 and be adsorbed on the flexible substrate 10. In other embodiments, the LEDs 20 can have two kinds of magnetism, such as N-pole magnetism and S-pole magnetism, and the flexible substrate 10 can generate either kind of magnetism, such as N-pole magnetism to adsorb the S-pole of the LED 20.

In this embodiment, the Block S3 and the Block S4 include: eliminating the magnetic field of the flexible substrate 10 and generating a magnetic field on the display substrate 30 to adsorb the LED 20. Specifically, the LED 20 has a single magnetism, the display substrate 30 generates a magnetism opposite to the LED 20, so that the LED 20 will be attracted by the display substrate 30 and be transferred from the flexible substrate 10 to the display substrate 30. In other embodiments, the LEDs 20 can have two kinds of magnetism, such as N-pole magnetism and S-pole magnetism, the display substrate 30 can generate either kind of magnetism, such as S-pole magnetism to adsorb the N-pole of the LED 20.

In this embodiment, after the Block S4, the mass transfer method further comprises: removing the flexible substrate 10 from the display substrate 30. Specifically, after transferring the LEDs 20 to the display substrate 30, the flexible substrate 10 can be removed from the display substrate to repeat the steps of the mass transfer method from Block S1 to Block S4, so that the flexible substrate 10 can be reused to reduce the cost.

By setting the flexible substrate 10 to transfer the LEDs 20, the LEDs can achieve batch transfer, which improves the efficiency of transfer. By using the magnetic field during the transfer process, the adsorption capacity on LEDs 20 can be enhanced, which improves the yield. By attaching the flexible substrate 10 to the display substrate 30 to transfer the plurality of LEDs 20, the LEDs 20 can be transferred from the wells 11 to the connecting pads 31 on the display substrate 30, so that the dislocation of LEDs 20 in the transfer process can be avoided, and further improving the product yield.

Third Embodiment

Figure 5:
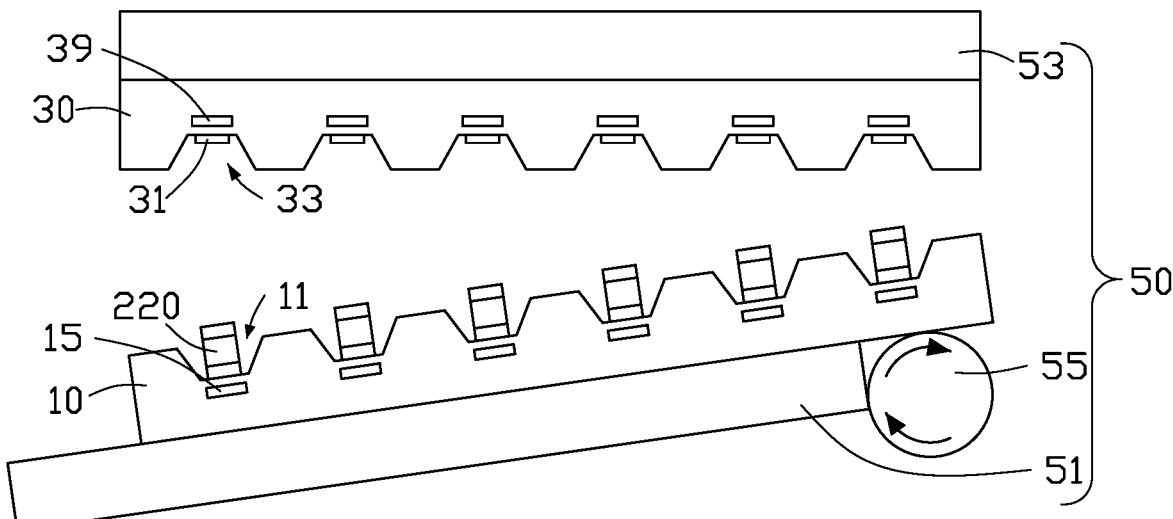
FIG. 5 is a partial side view of a mass transfer system according to a third embodiment of the present disclosure.
Figure 6:
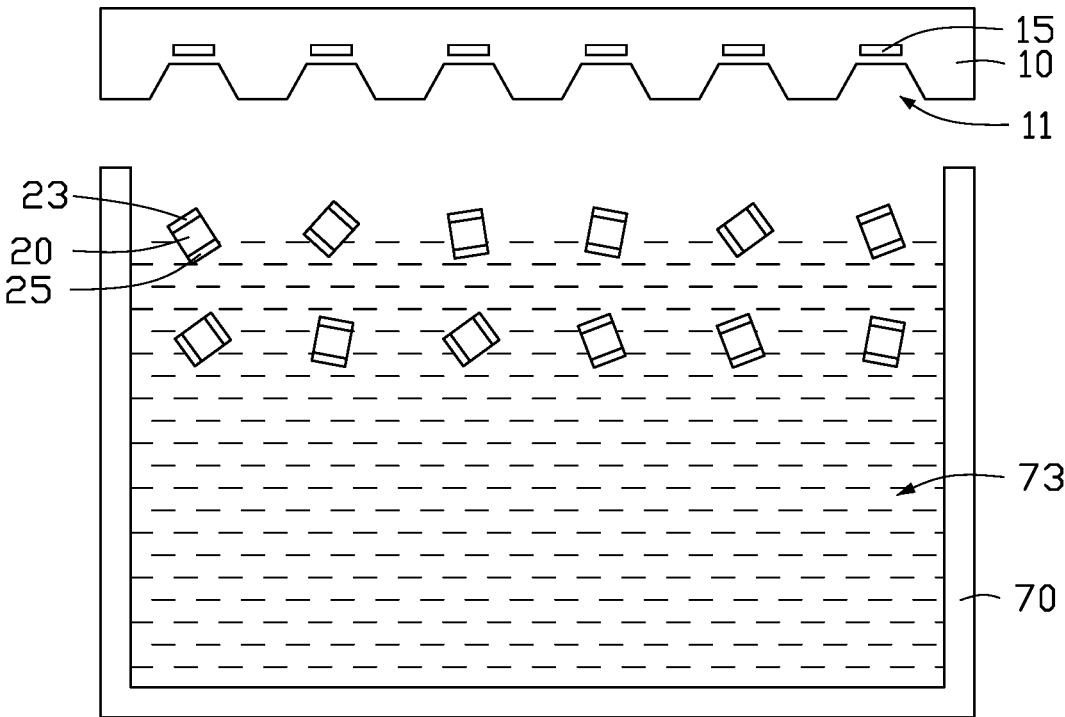
FIG. 6 is another partial sideview of the mass transfer system according to the third embodiment of the present disclosure.

FIG. 5 and FIG. 6 show a mass transfer system 200 used to transfer a large number (tens or hundreds of thousands) of LEDs 220 at one time according to a second embodiment of the present disclosure. The mass transfer system 200 includes a flexible substrate 10, a display substrate 30, an attaching device 50, and a chamber 70. The LED 220 includes a second magnetic pole 23 and a third magnetic pole 25. The second magnetic pole 23 and the third magnetic pole 25 arrange on the opposite side of the LED 220. A suspension 73 is received in the chamber 70 configured to accommodate the LEDs 220. A density of the suspension 73 is larger than a density of the LED 220, so that the LEDs 220 will suspend on the liquid level of the suspension 73.

In this embodiment, the flexible substrate 10 includes a third magnetic field generator 15 configured to generate a magnetic field on each well 11 to adsorb the second magnetic pole 23, so that each well 11 can adsorb a LED 220. Specifically, the magnetism generated by the third magnetic field generator 15 is opposite to the magnetism of the second magnetic pole 23 and is same as the magnetism of the third magnetic pole 25. According to the principle of mutual repulsion between the same magnetism and mutual attraction between different magnetism, when the magnetic field generated by the third magnetic field generator 15 is close to the LED 220, the second magnetic pole 23 will be close to the third magnetic field generator 15, and the third magnetic pole 25 will be far away to the third magnetic field generator 15. As a result, the LEDs 220 floating on the liquid level of the suspension 73 are suspended in the direction of the second magnetic pole 23 towards the flexible substrate 10, and will be adsorbed in the well 11 in the direction of the second magnetic pole 23 towards the flexible substrate 10 under the action of magnetic force.

In this embodiment, the display substrate 30 includes a fourth magnetic field generator 39 configured to generate a magnetic field on the connecting pad 31 to adsorb the third magnetic pole 25, so that each connecting pad 31 can adsorb a LED 220. Specifically, the magnetism generated by the fourth magnetic field generator 39 is opposite of the magnetism of the third magnetic pole 25. According to the principle of mutual attraction between different magnetism, when the magnetic field generated by the fourth magnetic field generator 39 is close to the LED 220, the third magnetic pole 25 of the LED 220 will be adsorbed by the connecting pad 31 under the action of magnetic force, and then be transferred to the connecting pad 31.

In this embodiment, as FIG. 5 shows, the flexible substrate 10 will flip 180° after adsorbing the LEDs 220, and then be placed on the first support platform 51 and close to the display substrate 30 to attach to the display substrate 30. The display substrate 30 is placed on the second support platform 53 in an inverted manner to avoid contamination by impurities (such as dust, etc.) falling on the display platform 30 before attaching the flexible substrate 10 to the display substrate 30. In other embodiments, the mass transfer system 200 can also be placed in a vacuum or sterile environment to avoid contamination with impurities.

By providing suspension 73 in the chamber 70, the LED 220 can suspend in the chamber 70. By setting different magnetic fields on the flexible substrate 10 and the display substrate 30, the LED 220 with two kinds of magnetism can be transferred.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A mass transfer system comprising:
   a flexible substrate defining a plurality of wells, each of the plurality of wells configured for adsorbing one of a plurality of light-emitting diodes (LEDs);
   a display substrate defining a plurality of connecting pads, each of the plurality of connecting pads configured for bonding one of the plurality of LEDs;
   a chamber accommodating the plurality of LEDs;
   a magnetic suspension device accommodated in the chamber and located at a bottom of the chamber, wherein the magnetic suspension device is configured to generate a magnetism having a same magnetic pole as a first magnetic pole of the plurality of LEDs, so that the plurality of LEDs is suspended in the chamber by magnetic repulsive forces between the plurality of LEDs and the magnetic suspension device; and
   an attaching device configured for attaching the flexible substrate to the display substrate;
   wherein the flexible substrate is configured to adsorb the plurality of LEDs from the chamber and to release the plurality of LEDs after the flexible substrate is attached to the display substrate.

2. The mass transfer system of claim 1, wherein the flexible substrate comprises a first magnetic field generator configured to generate a magnetic field having an opposite magnetic pole from the first magnetic pole on each of the plurality of wells.

3. The mass transfer system of claim 2, wherein the display substrate comprises a second magnetic field generator configured to generate a magnetic field having an opposite magnetic pole from the first magnetic pole on each of the plurality of connecting pads.

4. The mass transfer system of claim 2, wherein the display substrate further comprises a plurality of adhesive blocks, each of the plurality of adhesive blocks bonds a corresponding one of the plurality of connecting pads and a corresponding one of the plurality of LEDs.

5. The mass transfer system of claim 1, wherein the attaching device comprises a first support platform, a second support platform, and a roller, wherein the first support platform supports the flexible substrate, the second support platform supports the display substrate, the roller attaches the flexible substrate to the display substrate.

* * * * *